(12) United States Patent
Song et al.

(10) Patent No.: US 6,369,567 B1
(45) Date of Patent: Apr. 9, 2002

(54) NUCLEAR MAGNETIC RESONANCE METHOD AND APPARATUS FOR DETERMINING PORE CHARACTERISTICS OF ROCKS AND OTHER POROUS MATERIALS

(75) Inventors: Yi-Qiao Song; Seungoh Ryu, both of Ridgefield, CT (US)

(73) Assignee: Schlumberger Technology Corporation, Ridgefield, CT (US)

(*) Notice: Subject to any disclaimer, the term of this patent is extended or adjusted under 35 U.S.C. 154(b) by 0 days.

(21) Appl. No.: 09/272,964

(22) Filed: Mar. 19, 1999

(51) Int. Cl.[7] .................................................. G01V 3/00
(52) U.S. Cl. ........................................................ 324/303
(58) Field of Search ............................................ 324/303

(56) References Cited

U.S. PATENT DOCUMENTS

| | | | |
|---|---|---|---|
| 4,719,423 A | 1/1988 | Vinegar et al. | 324/303 |
| 5,023,551 A | 6/1991 | Kleinberg et al. | 324/303 |
| 5,055,787 A | 10/1991 | Kleinberg et al. | 324/303 |
| 5,565,775 A | 10/1996 | Stallmach et al. | 324/303 |
| 5,680,043 A | * 10/1997 | Hurlimann et al. | 324/303 |
| 5,712,566 A | * 1/1998 | Taicher et al. | 324/303 |

FOREIGN PATENT DOCUMENTS

WO      WO 92/09901      6/1992      ............ G01R/33/20

OTHER PUBLICATIONS

W.E. Kenyon, Nucl. Geophys. 6, 153, 1992.
R.L. Kleinberg, in "Encyclopedia of Nuclear Magnetic Resonance", Wiley, New York, 1995.
E. O. Stejskal and J. E. Tanner, J. Chem. Phys. 42, 288, 1965.
P.T. Callaghan, A Coy, D. MacGowan, K.J. Packer and F.O. Zelaya, Nature 351, 467, 1991.
M.D. Hurlimann, J. Magn. Res. 131, 232–40, 1998.
E.L. Hahn Phys. Rev. 80, 580, 1950.
R.M. Cotts, M.J.R. Hoch, T. Sun and J.T. Markert, J. Magn. Res. 83, 252, 1989.
T.S. Ramakrishnan, L.M. Schwartz, E.J. Fordham, W.E. Kenyon, D.J. Wilkinson, "Forward Models For Nuclear Magnetic Resonance In Carbonate Rocks", SPWLA, 1998.
J. E. Tanner, J. Chem. Phys. 52, 2523, 1970.
K. R. Brownstein and C. E. Tarr, Phys. Rev. A, 19, 2446, 1979.

\* cited by examiner

*Primary Examiner*—Hezron Williams
*Assistant Examiner*—Tiffany A. Fetzner
(74) *Attorney, Agent, or Firm*—William B. Batzer; Martin M. Novack

(57) ABSTRACT

A method for determining a pore characteristic of a substance includes the following steps: subjecting the substance to a substantially uniform static magnetic field; applying a magnetic pulse sequence to the substance, the pulse sequence being selected to produce nuclear magnetic resonance signals that are responsive to internal magnetic field inhomogeneities in the pore structure of the substance, and detecting, as measurement signals, nuclear magnetic resonance signals from the substance; applying a reference magnetic pulse sequence to the substance, the reference pulse sequence being selected to produce nuclear magnetic resonance signals that are substantially unresponsive to internal magnetic field inhomogeneities in the pore structure of the substance, and detecting, as reference measurement signals, nuclear magnetic resonance signals from the substance; and determining a pore characteristic of the substance from the measurement signals and the reference measurement signals.

55 Claims, 10 Drawing Sheets

NUCLEAR MAGNETIC RESONANCE METHOD AND APPARATUS FOR DETERMINING PORE CHARACTERISTICS OF ROCKS AND OTHER POROUS MATERIALS

FIELD OF THE INVENTION

This invention relates to investigation of rocks and other porous materials, and, more particularly, to nuclear magnetic resonance (NMR) methods and apparatus for determining pore characteristics of such substances either in the laboratory or in situ in earth formations.

BACKGROUND OF THE INVENTION

General background of nuclear magnetic resonance (NMR) well logging is set forth, for example, in U.S. Pat. No. 5,023,551. Briefly, in conventional NMR operation the spins of nuclei align themselves along an externally applied static magnetic field. This equilibrium situation can be disturbed by a pulse of an oscillating magnetic field (e.g. an RF pulse), which tips the spins away from the static field direction. After tipping, two things occur simultaneously. First, the spins precess around the static field at the Larmor frequency, given by $\omega_0 = \gamma B_0$, where $B_0$ is the strength of the static field and $\gamma$ is the gyromagnetic ratio. Second, the spins return to the equilibrium direction according to a decay time T1, which is called the longitudinal relaxation time constant or spin lattice relaxation time constant. For hydrogen nuclei, $\gamma/2\pi = 4258$ Hz/Gauss, so, for example, for a static field of 235 Gauss, the frequency of precession would be 1 MHz. Also associated with the spin of molecular nuclei is a second relaxation time constant, T2, called the transverse relaxation time constant or spin-spin relaxation time constant. At the end of a ninety degree tipping pulse, all the spins are pointed in a common direction perpendicular to the static field, and they all precess at the Larmor frequency. The net precessing magnetization decays with a time constant T2 because the individual spins rotate at different rates and lose their common phase. At the molecular level, dephasing is caused by random motions of the spins. The magnetic fields of neighboring spins and nearby paramagnetic centers appear as randomly fluctuating magnetic fields to the spins in random motion. In an inhomogeneous field, spins at different locations precess at different rates. Therefore, in addition to the molecular spin-spin relaxation of fluids, spatial inhomogeneities of the applied field also cause dephasing. Spatial inhomogeneities in the field can be due to microscopic inhomogeneities in the magnetic susceptibility of rock grains or due to the macroscopic features of the magnet.

A widely used technique for acquiring NMR data, both in the laboratory and in well logging, uses an RF pulse sequence known as the CPMG (Carr-Purcell-Meiboom-Gill) sequence. As is well known, after a wait time that precedes each pulse sequence, a ninety degree pulse causes the spins to start precessing. Then a one hundred eighty degree pulse is applied to cause the spins which are dephasing in the transverse plane to refocus. By repeatedly refocusing the spins using one hundred eighty degree pulses, a series of "spin echoes" appear, and the train of echoes is measured and processed. The transverse relaxation time constant, $T_2$, or the distribution of $T_2$'s, can be obtained using this technique.

Examination of porous substances is treated herein. Although porous materials appear in almost every aspect of the environment from naturally occurring rocks and woods to man-made materials such as concrete and food products, the characterization of the internal geometry of such materials remains difficult. Statistical description of the pore space is often most useful in understanding the physical properties of the materials, such as permeability to fluid flow. One of the most important statistical parameters is the linear dimension (d) characterizing the pore size. Nuclear magnetic resonance technique has been successfully used to measure the surface-to-volume ratio (<S/V>) of porous materials via spin relaxation (see W. E. Kenyon, Nucl Geophys. 6, 153, 1992; R. L. Kleinberg, in "Encyclopedia of Nuclear Magnetic Resonance", Wiley, N.Y., 1995) and to study pore structure using pulsed field gradient (pfg) techniques (see E. O. Stejskal and J. E. Tanner, J. Chem. Phys. 42, 288, 1965; P. T. Callaghan, A. Coy, D. MacGowan, K. J. Packer and F. O. Zelaya, Nature 351, 467, 1991). From the measurement of <S/V>, one may deduce a pore size $\iota$, as: $\iota \equiv 6/<S/V>$. This general methodology has been successful in characterizing sandstone formations. However, in materials with complex surface relaxivity, such as due to microporosity, clay and deviation from fast diffusion condition, the interpretation of the spin relaxation behavior may be complex and model-dependent.

It is among the objects of the present invention to provide improved technique and apparatus for characterizing the internal geometry of porous materials using nuclear magnetic resonance measurements.

SUMMARY OF THE INVENTION

When a porous material is subject to a uniform external magnetic field ($B_o$), an inhomogeneous magnetic field $B_i$ may appear inside the pore space, due to the contrast of the magnetic susceptibility ($\chi$) between the solid materials and the pore-filling fluid. One may estimate the magnitude of the internal field to be $B_i \sim \Delta\chi B_o$, where $\Delta\chi$ is the difference in susceptibilities. The inhomogeneity of this internal field can be rather large in sedimentary rocks ($\Delta\chi \sim 10^{-4}$–$10^{-6}$ (SI)) (see M. D. Hurlimann, J. Magn. Res. 131, 232–40, 1998) and cause problems in the measurements of diffusion constant and spin relaxation (see E. L. Han Phys. Rev. 80, 580, 1950; E. O. Stejskal and J. E. Tanner, J.Chem Phys. 42, 288, 1965; R. M. Cotts, M. J. R. Hoch, T. Sun and J. T. Markert, J. Magn. Res. 83, 252, 1989).

The present invention utilizes to advantage the fact that the internal magnetic field is a representation of the underlying geometry of a porous material. The spatial distribution of the internal field can be a measure of the pore geometry. A technique is set forth to characterize the decay of nuclear spin magnetization due to diffusion in the internal field (DDif) and define a length scale $\iota_{DDif}$ (corresponding to pore size) in terms of the diffusion behavior. The technique has been used to study the water diffusion in samples of random-packed beads of several sizes and sedimentary rock samples, which demonstrated the utility of the approach.

A significant aspect of the technique hereof is that it is insensitive to relaxation, so it provides a conceptually different characterization of porous materials from the widely used spin relaxation method. Particularly in cases where the spin relaxation is dominated by the inclusion of clay, microporosity, wettability and other types of variation of surface relaxation, the spin relaxation method is not reliable in determining physical properties such as permeability. [Carbonate rock has provided an example showing that the interpretation of relaxation data may be difficult and model dependent (see T. S. Ramakrishnan, L. M. Schwartz, E. J. Fordham, W. E. Kenyon, D. J. Wilkinson, SPWLA, 1998).]

In accordance with an embodiment of the method of the invention, there is provided a technique for determining a pore characteristic of a substance, comprising the following steps: subjecting the substance to a substantially uniform static magnetic field; applying a magnetic pulse sequence to the substance, the pulse sequence being selected to produce nuclear magnetic resonance signals that are responsive to internal magnetic field inhomogeneities in the pore structure of the substance, and detecting, as measurement signals, nuclear magnetic resonance signals from the substance; applying a reference magnetic pulse sequence to the substance, the reference pulse sequence being selected to produce nuclear magnetic resonance signals that are substantially unresponsive to internal magnetic field inhomogeneities in the pore structure of the substance, and detecting, as reference measurement signals, nuclear magnetic resonance signals from the substance; and determining a pore characteristic of the substance from the measurement signals and the reference measurement signals.

In a preferred embodiment of the invention, the step of determining a pore characteristic of the substance comprises dividing values derived from the measurement signals by values derived from the reference measurement signals. In this embodiment, the step of applying a magnetic pulse sequence comprises applying a plurality of pulse sequences that include respective different wait times, $t_d$, during which diffusion in the internal magnetic field inhomogeneities can occur. Also in this embodiment, each of the pulse sequences comprises a series of pulse sequences with phase cycling, and the measurement signals for each of said plurality of pulse sequences are obtained by combining the detected nuclear magnetic resonance signals from the associated series of pulse sequences. Also in this embodiment, the step of determining a pore characteristic includes plotting the results of the previously mentioned dividing as a function of $t_d$, and determining the pore characteristic from said plot.

Further features and advantages of the invention will become more readily apparent from the following detailed description when taken in conjunction with the accompanying drawings.

DETAILED DESCRIPTION

Figure 1:
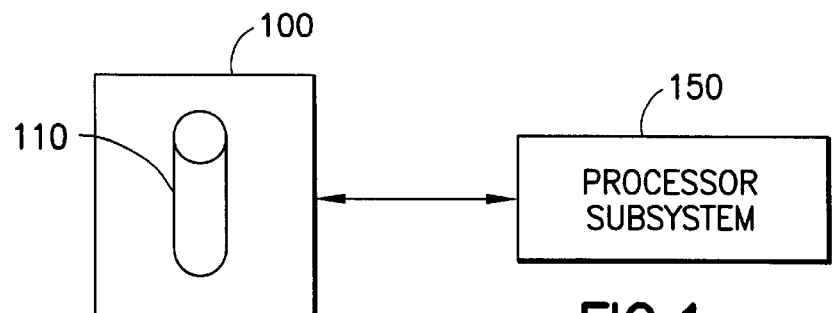
FIG. 1 is a block diagram of an NMR laboratory apparatus that can be used in practicing embodiments of the invention.

Referring to FIG. 1, there is shown nuclear magnetic resonance (NMR) measuring equipment 450 which, in conjunction with a suitably programmed processor subsystem 150, can be used in practicing embodiments of the invention for determining a pore characteristic of a substance. A sample 110 of a substance, which can be any substance, but will generally be rock, such as a core sample from the earth, or other porous material, is provided in the measuring equipment 100. The equipment 450 may be any suitable NMR equipment of conventional type (for example, a Model Avance of Bruker Instruments Inc.) that can produce a substantially uniform static magnetic field and can produce radio frequency (RF) pulses at controlled times and of controlled frequency, phase, and duration.

Figure 2:
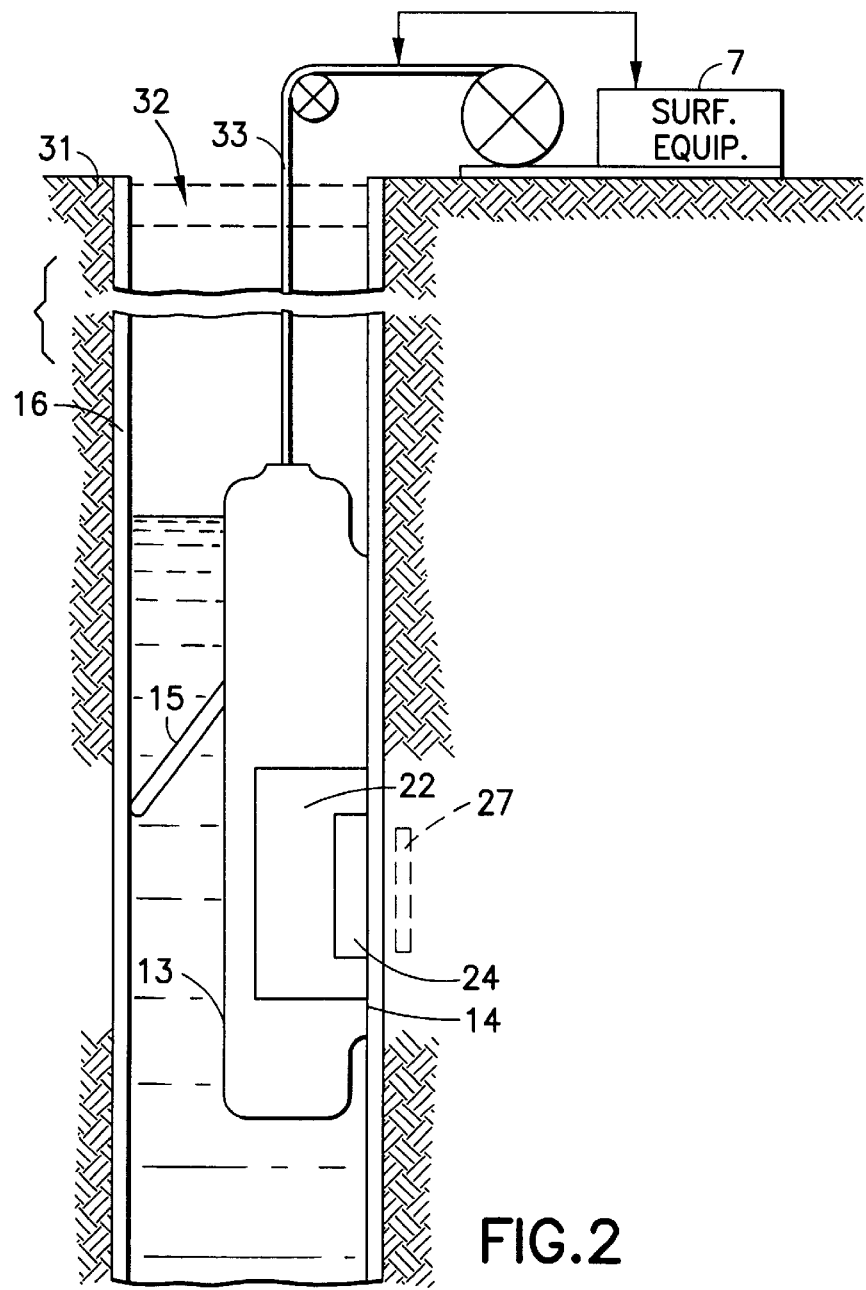
FIG. 2 is a schematic diagram, partially in block form, of a well logging apparatus that can be used in practicing embodiments of the invention.

Embodiments of the technique of the invention can also be employed using well logging apparatus to investigate, in situ, a region of earth formations surrounding a borehole to determine a pore characteristic of the region. FIG. 2 illustrates an embodiment of such an apparatus for investigating subsurface formations 31 traversed by a borehole 32. A magnetic resonance investigating apparatus or logging device 30 is suspended in the borehole 32 on an armored cable 33, the length of which substantially determines the relative depth of the device 30. The length of cable 33 is controlled by suitable means at the surface such as a drum and winch mechanism (not shown). Surface equipment, represented at 7, can be of conventional type, and can include a processor subsystem and communicates with the all the downhole equipment. It will be understood that processing can be performed downhole and/or uphole, and that some of the processing may be performed at a remote location. Also, while a wireline is illustrated, alternative forms of physical support and communicating link can be used, for example in a measurement while drilling system. As described for example in the U.S. Pat. No. 5,055,787, the magnetic resonance logging device 30 can have a face 14 shaped to intimately contact the borehole wall, with minimal gaps or standoff. The borehole wall may have a mudcake 16 thereon. A retractable arm 15 is provided which can be activated to press the body of the tool 13 against the borehole wall during a logging run, with the face 14 pressed against the wall's surface. Although the tool 13 is shown as a single body, the tool may alternatively comprise separate components such as a cartridge, sonde or skid, and the tool may be combinable with other logging tools.

The logging device includes, for example, a permanent magnet or permanent magnet array 22, which may comprise samarium-cobalt magnetic material, and one or more RF antennas 24. The investigation region, or sensitivity zone, represented generally at 27, is a region in the formations in which the static magnetic field is substantially uniform.

Figure 3:
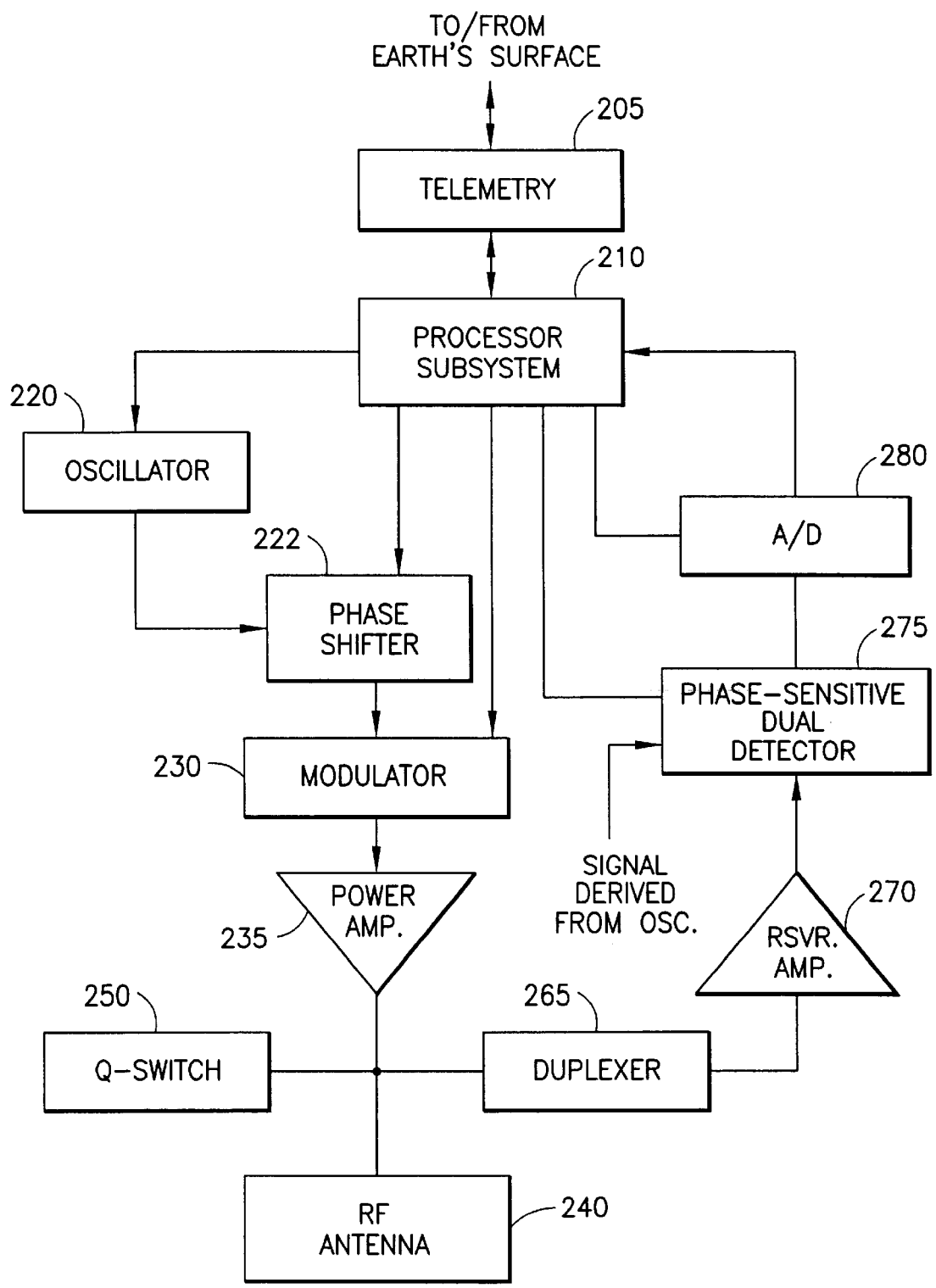
FIG. 3 is a block diagram of downhole circuitry of the FIG. 2 embodiment.

FIG. 3 shows, in simplified form, circuitry of a type that can be used for producing RF pulse sequences and for receiving and processing NMR signals. In the Figure diagram, a downhole processor subsystem is represented at 210. The processor subsystem 210 has associated memory, timing, interfaces, and peripherals (not separately shown), as is well known in the art. The processor subsystem is conventionally coupled with telemetry circuitry 205, for communication with the earth's surface. An oscillator 220 produces radio frequency (RF) signals at the desired resonant frequency or frequencies in the investigation region, and the output of the oscillator is coupled to a phase shifter 222 and then to a modulator 230, both of which are under control of the processor subsystem 210. The phase shifter and modulator can be controlled, in a manner known in the art, to produce the desired pulses of RF field, for example the 90 degree and 180 degree pulses utilized in embodiments hereof. As described, for example, in the U.S. Pat. No. 5,055,788, the oscillator 220 can be a plurality of oscillators used in a manner that facilitates the generation and ultimate detection of the desired signals. The output of modulator 230 is coupled, via a power amplifier 235, to the RF antenna 240. A Q-switch 250 can be provided to critically damp the RF antenna system to reduce antenna ringing. The antenna 240 is also coupled with a receiver section via duplexer 265, the output of which is coupled to receiver amplifier 270. The duplexer 265 protects the receiver amplifier 270 from the high power pulses which pass to the RF antenna 240 during the transmitting and damping modes. During the receiving mode, the duplexer 265 is effectively just a low impedance connection from the antenna to the receiver amplifier 270. The output of the receiver amplifier 270 is coupled to a dual phase-sensitive detector 275, which also receives, as a reference, a signal derived from the oscillator signal. The detected output is coupled to analog-to-digital converter 280, the output of which is a digital version of the received nuclear magnetic resonance signal.

An embodiment hereof involves application of a series of three radio-frequency (rf) pulses at the Larmor frequency of the nuclear spin, separated by time intervals $t_e$ and $t_d$:

$$\frac{\pi}{2} - t_e - \frac{\pi}{2} - t_d - \frac{\pi}{2} - t_e - echo \quad (1)$$

The symbol $\pi/2$ denotes a radio-frequency (RF) pulse that rotates the nuclear spin vector by $\pi/2$. The sequence, called a stimulated echo sequence, was introduced by Hahn (see E. L. Hahn Phys. Rev 80, 580 (1950)), and has been widely used in combination with applied magnetic field gradients to measure diffusion constant (see J. E. Tanner, J. Chem. Phys. 52, 2523 (1970)) and to study the structure of porous materials (see P. T. Callaghan, A. Coy, D. MacGowan, K. J. Packer and F. O. Zelaya, Nature 351, 467 (1991)). In the DDif approach hereof, no applied gradients are necessary.

Neglecting relaxation, the echo intensity can be shown to follow the equation $$DDif(t_e, t_d) = \int dx_1 dx_2 e^{i\gamma t_e [B_i(x_1) - B_i(x_2)]} P_{x_1, x_2, t_d}, \quad (2)$$

where $B_i(x)$ is the internal magnetic field and $\gamma$ is the gyromagnetic ratio of the probed spins. $x_1$ and $x_2$ are the initial and the final position of a spin and $P(x_1 x_2, t_d)$ is the diffusion propagator, the probability of the molecule to diffuse from $x_1$ to $x_2$ during time $t_d$. For $t_e < t_d$, one can neglect diffusion during $t_e$ and focus on the diffusion effect during $t_d$. At large $t_d$, the diffusion distance may be as large as the pore size, thus it is important to consider the full spatial dependence of $B_i(x)$.

Since the internal field has a maximum and a minimum within the pore space, the diffusion of water in the extended pore volume can be viewed as diffusion in a bounded $B_i$ space. Intuitively, at short diffusion time when the diffusion length is much smaller than the pore size, the magnetization decay will be governed by the local field inhomogeneities. However, at long time when the water molecules have experienced all possible field values, the decay will cease. This behavior of decay at short times and saturation at long times is a signature of the bounded $B_i$ space. A time constant $t_c$ can be defined as the decay rate approaches zero, $t_c \sim d^2/D_o$, where $D_o$ is the bulk diffusion constant and d is the pore diameter. A pore size length scale can then be obtained via $L_{DDif} \approx \sqrt{2D_0 t_c}$. The saturated signal intensity is dependent on $t_e$ and the internal field distribution. Experiments on samples of random-packed glass beads of varying sizes have show that $L_{DDif}$ is proportional to the bead diameters.

The relaxation effects can be measured using a reference sequence, discussed further hereinbelow. The additional decay due to diffusion in the internal field, $DDif(t_e, t_d)$, is then obtained by taking the ratio of the echo and the reference signals.

Regarding pore size distribution, when samples contain distribution of pore sizes that are separated by distance larger than the diffusion length, the measured echo height is the sum of all pores:

$$DDif(t_e, t_d) = \frac{\sum_i p_i \cdot E_i(t_d)}{\sum_i p_i \cdot R_i(t_d)}, \text{ and } \sum_i p_i = 1, \quad (3)$$

where $p_i$ is the volume of the i-th pore and $E_i(t_d)$ is the echo height associated with i-th pore. The function $R(t_d)$ describes the spin-lattice relaxation during $t_d$ and for constant relaxation time $T_{1i}$, $R_i(t) = \exp(-t/T_{1i})$.

The functional form of DDif(t) depends on the details of the internal field distribution. Qualitatively, for well separated pores, the pore size may affect the spin-lattice relaxation rate and $T_1$ is often smaller for smaller pores. DDif(t) also exhibits more rapid decay for smaller pores. So, the short time ($t_d$) behavior of $DDif(t_e, t_d)$ is typically dominated by the small pores and the long $t_d$ behavior by the larger pores. A variety of behavior for $DDif(t_e, t_d)$ can be expected for different pore sizes and $T_1$ distributions.

In the case when the small and large pores are strongly coupled, such as located spatially within $\sqrt{2D_0 T_1}$, the fast diffusion limit may apply and all molecules would have the same average $T_1$. In this case, $R_i(t) \approx \exp(-t/T_1)$ and Eq. (3) may be further simplified as in Eq. (4) to follow. [The rigorous treatment of connected pores should explicitly include diffusion between pores of different sizes. However, the qualitative behavior should be similar to the sum of the DDif functions for individual pore.]

$$DDif(t_e, t_d) = \sum_i p_i \cdot DDif_i(t_d). \quad (4)$$

Pore sizes can be obtained from the time dependence of the decay and the porosity from the amplitude of the decay. The fast diffusion condition is often satisfied in carbonate rocks partly due to the weak surface relaxation.

Analytical solution for spin relaxation in a restricted space has been studied by Browstein and Tarr (see K. R. Brownstein and C. E. Tarr, Phys. Rev. A, 19, 2446, (1979). An extension of that analysis for the stimulated echo in generalized magnetic field profile has been developed. The essential difference between the spin relaxation and the stimulated echo decay is the extra phase accumulation due to the internal field. This allows the stimulated echo to probe the first traverse of water molecules through the pores and measure the corresponding diffusion time $T_D$. Starting from Eq. (2), one can derive the echo and the reference signal intensity for spherical pores in the fast diffusion limit and obtain the full functional form for DDif($t_d$) as:

$$DDif(t) \approx (1-\eta) + \eta e^{t/T_1}[e^{-t/T_D} - \sqrt{\pi} \sqrt{t/T_D}(1-erf(\sqrt{t/T_D}))]. \quad (5)$$

Here, $T_D \equiv d^2/4D_0\pi^2$ is a diffusion time, and erf is the error function. $T_1$ is the spin-lattice relaxation time under fast diffusion condition, $1/T_1 \equiv \rho\pi^2/2d$ and it is assumed that $T_1 > T_D$. The factor $\eta$ determines the amplitude of the decay and is a function of $t_e$ and the properties of the magnetic field profile. When detailed information on the internal field distribution is not available, $\eta$ may be treated as a fitting parameter. This function has been shown to fit the experimental DDif data over up to 3 decades in $t_d$ for glass bead samples and several sandstone rock samples. In principle, a distribution of pore sizes can be obtained from fitting the experimental DDif data using Eq. (5) as the basis functions for individual pores sizes.

During $t_d$, the z magnetization experiences decay due to spin-lattice relaxation, in addition to diffusion. In order to separate the decay due to diffusion, a reference sequence is designed to measure the decay due to spin-lattice relaxation:

$$\frac{\pi}{2} - t_e - \pi - t_e - \frac{\pi}{2} - t_d - \frac{\pi}{2} - \text{fid signal} \quad (6)$$

The signal acquired as a function of $t_d$ is defined to be $R(t_d)$. The $\pi$ pulse refocuses the spins at the time of the second $\pi/2$ pulse so that no net phase is accumulated due to the internal field. The amplitude of the fid signal acquired after the last $\pi/2$ pulse is not affected by the internal field. A similar concept is used in diffusion measurements (see R. M. Cotts, M. J. R. Hoch, T. Sun and J. T. Markert, J. Magn. Res. 83, 252 (1989)). In addition to the relaxation during $t_d$, the transverse spin relaxation will be effective during $t_e$ periods in both sequences (Eq. (1) and Eq. (6)). So, the effects of the spin-lattice and the transverse relaxation are calibrated by the reference sequence.

A pulse sequence for measuring DDif is described in Eq. (1) above. In general, there will be four other (spurious) echoes generated in addition to the stimulated echo. These extra echoes may interfere with the stimulated echo and should be removed. Two methods can be used to remove these echoes. One method is to apply an external magnetic field gradient after the second pulse to dephase the transverse magnetization and thus all extra echoes. However, when $t_d$ is short, the use of a gradient pulse may be difficult.

The second method uses several combinations of phases of the three RF pulses in order to cancel the unwanted echoes, because the sign dependence of the extra echoes are different from that of the stimulated echo. One possible phase cycling is listed in Table 1.

TABLE 1

| $\phi_1$ | $\phi_2$ | $\phi_3$ | ACQ |
|---|---|---|---|
| 0 | 0 | 0 | 0 |
| $\pi$ | 0 | 0 | 2 |
| 0 | $\pi$ | 0 | 2 |
| $\pi$ | $\pi$ | 0 | 0 |

There are four pulses used in the reference sequence and several echoes may appear after the final pulse. Similarly, the use of magnetic field gradient pulse following the third pulse may remove the unwanted echoes effectively without phase cycling. However, when $t_d$ is short, the phase cycling method (Table 2) can be used.

TABLE 2

| $\phi_1$ | $\phi_\pi$ | $\phi_2$ | $\phi_3$ | ACQ |
|---|---|---|---|---|
| 0 | $\pi/2$ | 0 | 0 | 0 |
| $\pi$ | $\pi/2$ | 0 | 0 | 2 |
| 0 | $\pi/2$ | $\pi$ | 0 | 2 |
| $\pi$ | $\pi/2$ | $\pi$ | 0 | 0 |
| 0 | $3\pi/2$ | 0 | 0 | 0 |
| $\pi$ | $3\pi/2$ | 0 | 0 | 2 |
| 0 | $3\pi/2$ | $\pi$ | 0 | 2 |
| $\pi$ | $3\pi/2$ | $\pi$ | 0 | 0 | in both tables $\phi_1$, $\phi_2$ and $\phi_3$ are the RF phases of the three $\pi/2$ pulses, respectively, and in Table 2, $\phi_\pi$ is the phase of the last $\pi$ pulse. The phase cycling will cancel all extra signals except the echo at $t_e$ after the last pulse. Varying $\Phi_3$ between 0 and $\pi$ will remove this echo.

Several sandstone rocks and carbonate rocks have been investigated using the technique hereof. In rocks with relatively narrow pore size distributions, the characteristic DDif behavior was observed: the DDif signal shows the initial decay and saturation at long $t_d$. For sandstone samples with a bimodal pore size distribution, the DDif data is a superposition of the behavior from individual pores and the pore size distribution can be estimated. For sandstone rocks, the pore sizes ($l_{DDif} \equiv \sqrt{2D_0 t_c}$) derived from the DDif technique hereof compare closely with the visual estimate from thin-section micrographs.

Figure 10:
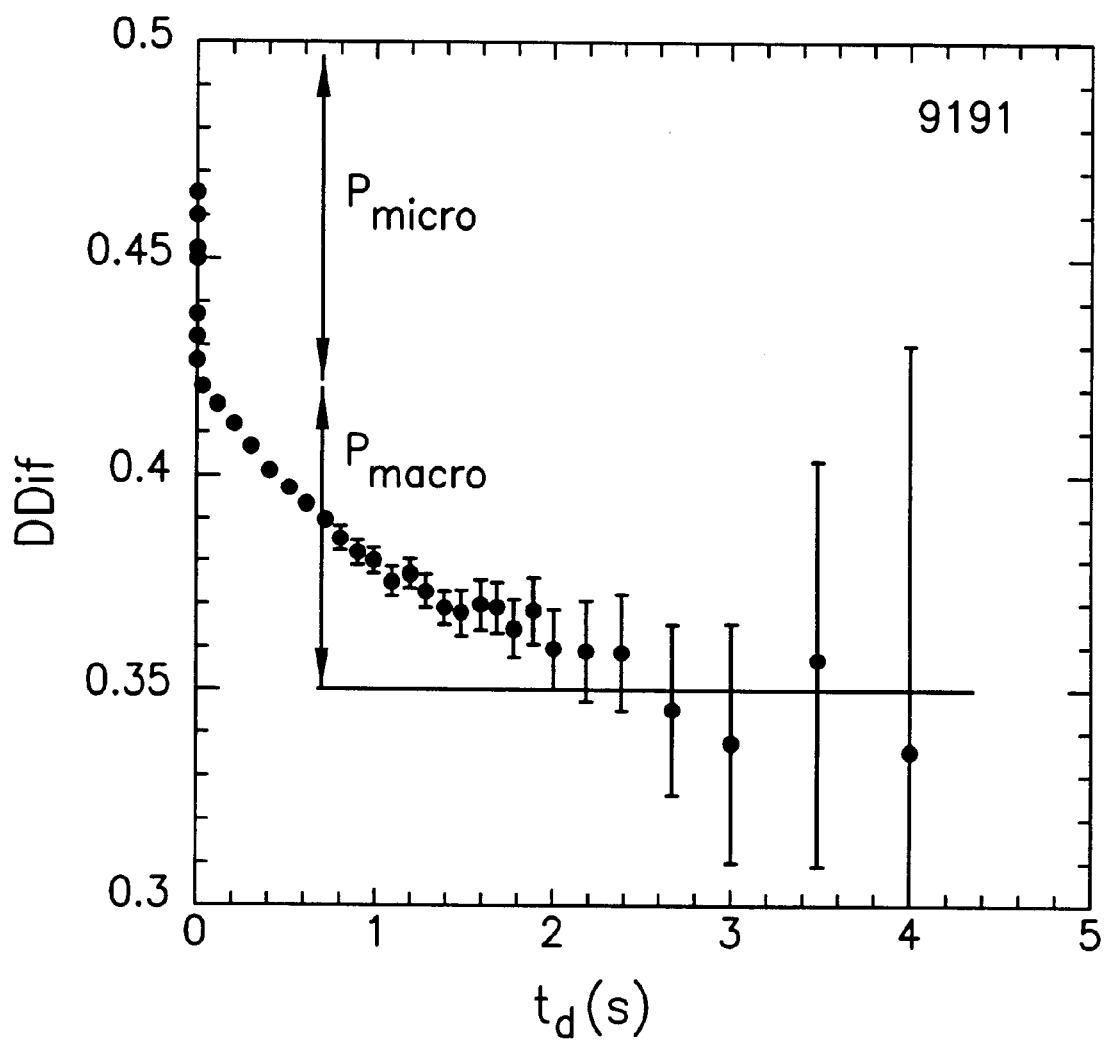
FIG. 10 shows representative measurements for a sample from a carbonate formation.
Figure 11:
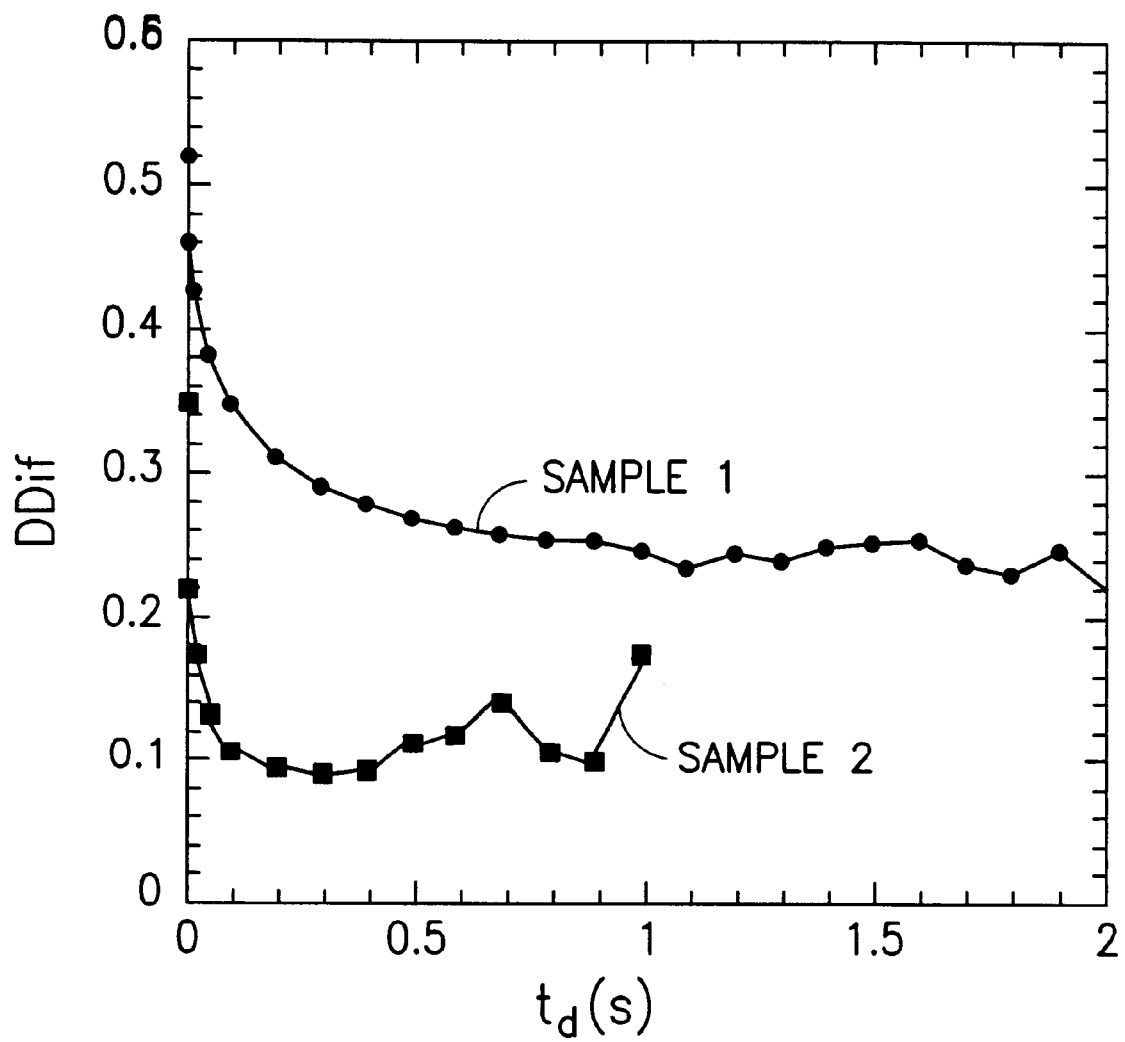
FIG. 11 shows representative measurements for samples from two sandstone formations.

One representative measurement for a carbonate sample is shown in FIG. 10. For the sample shown, initial DDif decay occurs over a short time period of up to 10 ms. This decay is caused by the water molecules diffusing within pores of the size $\sqrt{2D_0 t_c} \approx 6 \mu m$ ($D_0 \approx 2 \times 10^{-5}$ cm$^2$/s at 20 C), apparently associated with the microporosity of the rocks. After the initial reduction, the DDif signal continues to decay over a long time period, up to 3 sec. Thus, the length scale associated with the slower decay can be estimated to be 110 $\mu$m. This data indicates unambiguously the presence of two distinct length scales in such materials, most likely associated with the micro- and the macro-porosity of the samples. FIG. 11 shows the DDif versus $t_d$ characteristic for two sandstone samples.

A good proportionality between $l_{DDif}$ and the low-field $T_2$ values has been found. Permeability can be calculated using the following formula:

$$k \approx A \cdot \phi^4 l_{DDif}^2 \quad (7)$$

where $\phi$ is the porosity and the prefactor is A=$10^{-6}$ (mD/$\mu$m$^2$) This equation is derived from the empirical finding of Kenyon (see W. E. Kenyon, Nucl. Geophys. 6, 153 (1992)).

The essence of the DDif methodology is the measurement of the effects of local magnetic field that molecules experience as they diffuse. The stimulated echo pulse sequence is a simple experiment to determine such property. Modification such as replacing the last $\pi/2$ pulse with a refocusing sequence, such as a CPMG sequence, may be used to improve signal-to-noise ratio.

The occurrence of magnetic field inhomogeneity in porous materials is a general phenomenon as long as the susceptibility of the materials is different from that of the filling fluid. The susceptibility contrast of water and sedimentary rocks varies from $10^{-6}$–$10^{-4}$ (SI) and internal magnetic inhomogeneity as high as 10T/m may be present at 50 mT (see M. D. Hurlimann, J. Magn. Res. 131, 232–40

(1998)). Most importantly, the phase factor (Φ) in Eq. 2 can be controlled by the pulse sequence:

$$\phi \equiv \gamma t_e [B_i(x_1) - B_i(x_2)] \quad (8)$$

$$= (\alpha \gamma t_e \Delta \chi B_0) \cdot [b(x_1) - b(x_2)] \quad (9)$$

where $B_0$ is the external field and $b(\chi)$ is dimensionless function between 0 and 1, and $\alpha$ is a constant of order 1. Thus, the scale of Φ and decay of $\lim_{t_d \to \infty} E(t_e, t_d)$ is determined by $\gamma t_e \Delta \chi B_0$, and experimentally controlled quantity. This also leads to one of the advantages of this method that the signal decay due to diffusion can be made very low to maintain good signal-to-noise ratio. For example, a 10–20% decay in $E(t_e, t_d)$ is adequate in defining $t_e$ and $t_{DDif}$. In addition, there can be optimum choice of $t_e$.

Since only rf pulses are used which can be generated within a few microseconds and no external gradients are applied, the minimum diffusion time to be studied by this method can be as short as microseconds which corresponds to a water diffusion length of less than 0.1 μm. Thus, the length scale detectable by this method using water may range from 0.1–100 μm. This length can be further enhanced by using hyperpolarized xenon and helium and other gases. Also, due to the technical simplicity, this method may be used with very simple instrumentation or under stringent experimental conditions such as process control and borehole logging.

The presence of external magnetic field gradients will change the landscape of the magnetic field inside the pore space. In addition to the internal field (generated by the susceptibility contrast) which varies over a length scale related to the pore sizes, the external gradients introduce another independent length scale unrelated to pores, typically on the order of the sample size. Thus the long time limit of the echo height will no longer be constant, but with a decay determined by the external length scale. However, this may not be a practical problem when the external length scale is much longer than the pore sizes or when the external gradients are known.

When the external gradients are very large, however, $\sim \Delta \chi B_0 / d$, the simple interpretation of the DDif method will not be expected to work.

Because of the simplicity of the pulse sequence, it is conceivable to use the DDif method in place of or in combination with the traditional CPMG method for well logging, such as in carbonate formations. One of the disadvantages of the DDif method, however, is the relatively longer time to complete a suite of experiments with systematically varied $t_d$'s so that the logging speed may be limited.

A more serious limitation for well logging is due to limitations on the strength of the external magnetic field that will be practically available. This is because the inhomogeneity due to internal fields should exceed the external gradients from the tool:

$$\frac{\Delta \chi B_0}{d} > g_{tool} \quad (10)$$

d is the pore size to be detected. A preferred tool, such as a pad tool, should have a high B0 and low gradients. For a dipole magnet, $B_0 \approx M/r^3$ and $g \approx M/r^4$, where M is the magnetic moment of the magnet and r is the distance of the detection region from the center of the magnet. In this case, the condition of Eq. 10 is:

$$\Delta \chi > \frac{d}{r}. \quad (11)$$

For a design where $r \sim 10^2$ mm, if $d \sim 0.1$ mm, then $\Delta \chi$ should be larger than $10^{-3}$, so the technique can readily be used directly in high susceptibility formations. For low susceptibility formations, a paramagnetic or ferromagnetic drilling fluid could be used during logging to enhance $\Delta \chi$.

Figure 4:
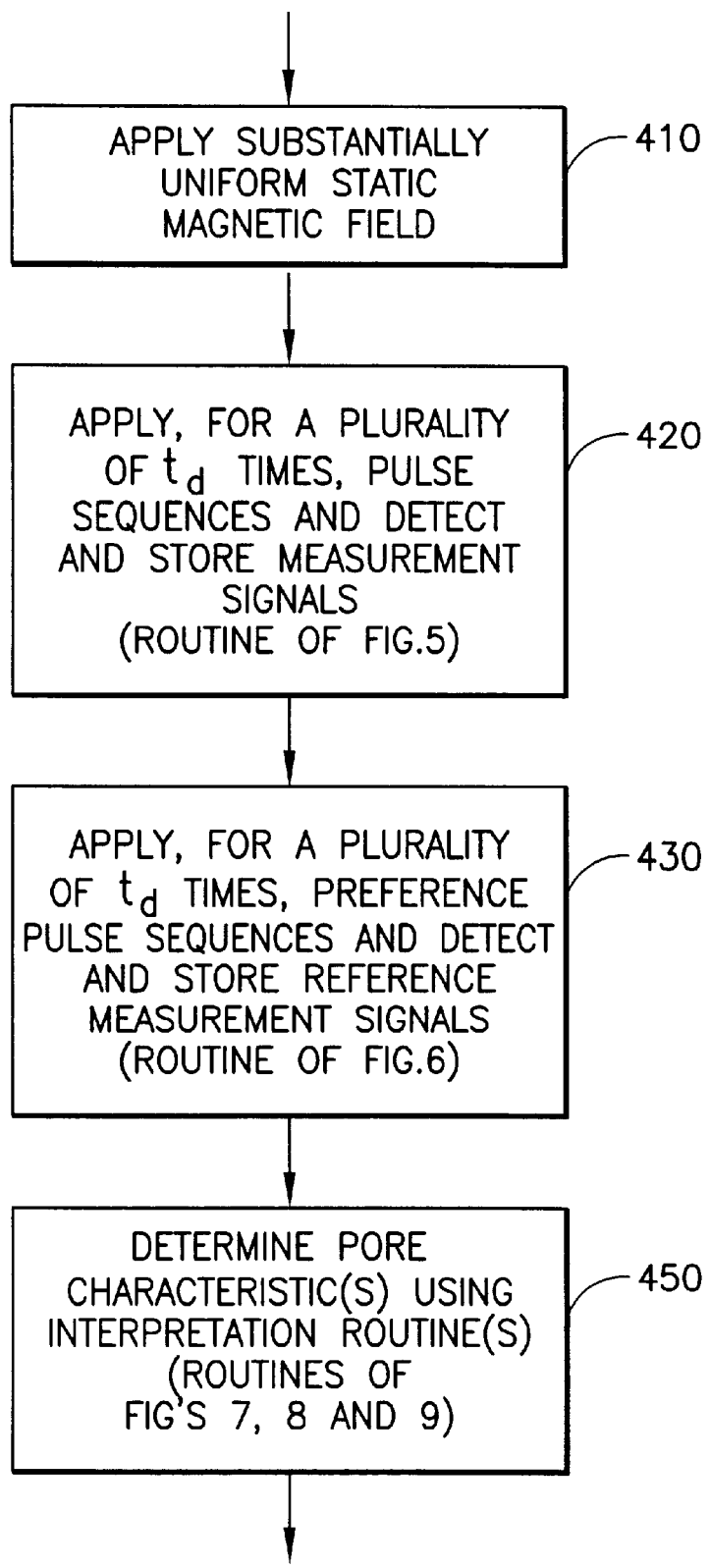
FIG. 4 is a flow diagram of a routine which, when taken in conjunction with the routines referred to therein, can be used in programming a processor or processors in implementing embodiments of the invention.

Referring to FIG. 4, there is shown a flow diagram of a routine which, when taken together with the routines referred to therein, can be used in programming a processor or processors in implementing embodiments of the invention. The processor may be, in the FIG. 1 embodiment, the subsystem 150, or, in the FIG. 2 embodiment, the downhole processor, the uphole processor, or a combination thereof. A remote processor may also be used for implementing the interpretation part of the routine. The block 410 represents applying a substantially uniform static magnetic field to the region of investigation, which may be, for example, in a laboratory, a substance being evaluated using nuclear magnetic resonance laboratory equipment, or, in a well logging application, a region of earth formations surrounding a borehole that is under investigation. [Theoretically, in a situation where there is a high magnetic susceptibility contrast, the earth's magnetic field could be used as the static field; but in most practical situations, this is not preferred.] Magnetic pulse sequences are then applied to the region of investigation, and nuclear magnetic resonance signals are detected from the region of investigation. These signals, called measurement signals, are stored for subsequent processing. This is represented by the block 420, and is described in further detail in conjunction with the routine of FIG. 5. As described herein, the pulse sequences, such as the pulse sequence of (1) above with varying wait times, $t_d$, are selected to produce nuclear magnetic resonance signals that are responsive to internal magnetic field inhomogeneities in the pore structure of the substance in the region of investigation.

Further magnetic pulse sequences, called reference pulse sequences, are then applied to the region of investigation, and nuclear magnetic resonance signals are detected from the region of investigation. These signals, called reference measurement signals, are stored for subsequent processing. This is represented by the block 430, and is described in further detail in conjunction with the routine of FIG. 6. As described herein, the reference pulse sequences, such as the pulse sequence of (7) above with varying wait times, $t_d$, are selected to produce nuclear magnetic resonance signals that are substantially unresponsive to internal magnetic field inhomogeneities in the pore structure of the substance in the region of investigation. [It will be understood that any desired order of obtaining the measurement signals and reference measurement signals can be used; that is, with either one obtained first, or in mixed order.] One or more pore characteristics of the substance in the investigation region is then determined from the measurement signals and the reference measurement signals, as represented by the block 450, which is described in further detail in conjunction with the flow diagrams of FIGS. 7, 8, and 9 which set forth embodiments of interpretation routines in accordance with embodiments of the invention.

Figure 5:
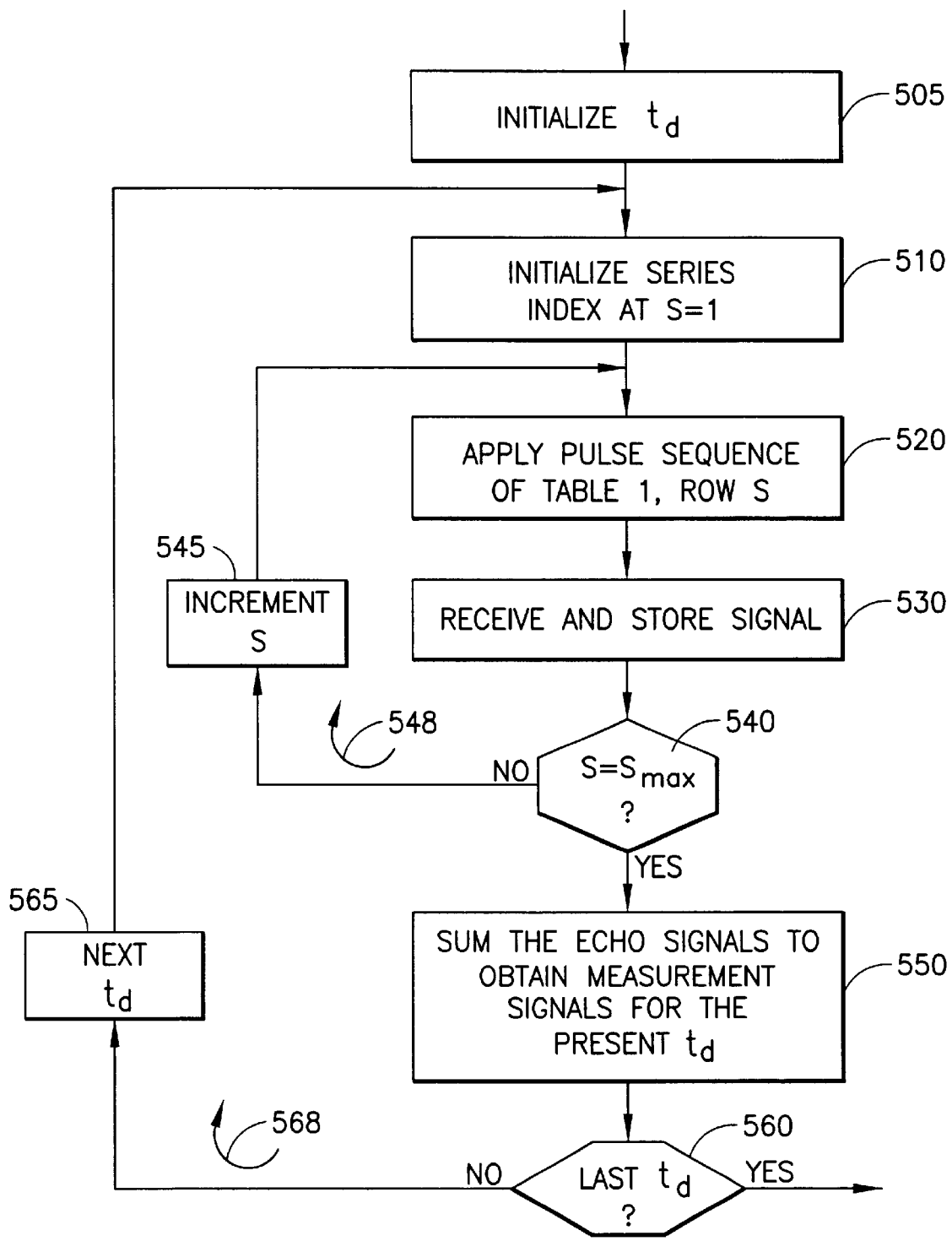
FIG. 5 is a flow diagram of a routine as represented by the block 420 of FIG. 4 for applying magnetic pulse sequences and detecting and storing measurement signals.

Referring to FIG. 5, there is shown a flow diagram of an embodiment of a routine as represented by the block 420 of FIG. 4. A wait time $t_d$ is initialized to a first value thereof (block 505). The blocks 520 and 530 represent the basic operations of applying the pulse sequence (for example, the pulse sequence of (1) above) and receiving and storing the echoes (as measurement signals). However, as first noted above, in an embodiment hereof it is advantageous to use a series of pulse sequences to remove spurious echoes. For example, the series of pulse sequences shown in Table 1 is used in the present embodiment. This is implemented in the flow diagram of FIG. 5 by initializing a "series" index at 1 (as represented by the block 510) the index representing the row of Table 1 whose pulse sequence is to be utilized next. The decision block 540 determines whether the last row of Table 1 has been reached (that is, the index has reached 4 in this example), and, until it is reached, the loop 548 will continue, with the row index being incremented each time (as represented by block 545), so that each pulse sequence in the series is performed, with the detected NMR signals therefrom being stored. When the index reaches 4, the stored signals are summed (block 550) to obtain the measurement signal for the series of pulse sequences, at the present $t_d$, that are responsive to the internal field inhomogeneities. Inquiry is then made (decision block 560) as to whether the last value of $t_d$ to be used has been reached. If not, the block 565 is entered, this block representing the setting of $t_d$ to the next value thereof to be used. The loop 568 then continues until signal data has been obtained and stored for each predetermined value of $t_d$.

Figure 6:
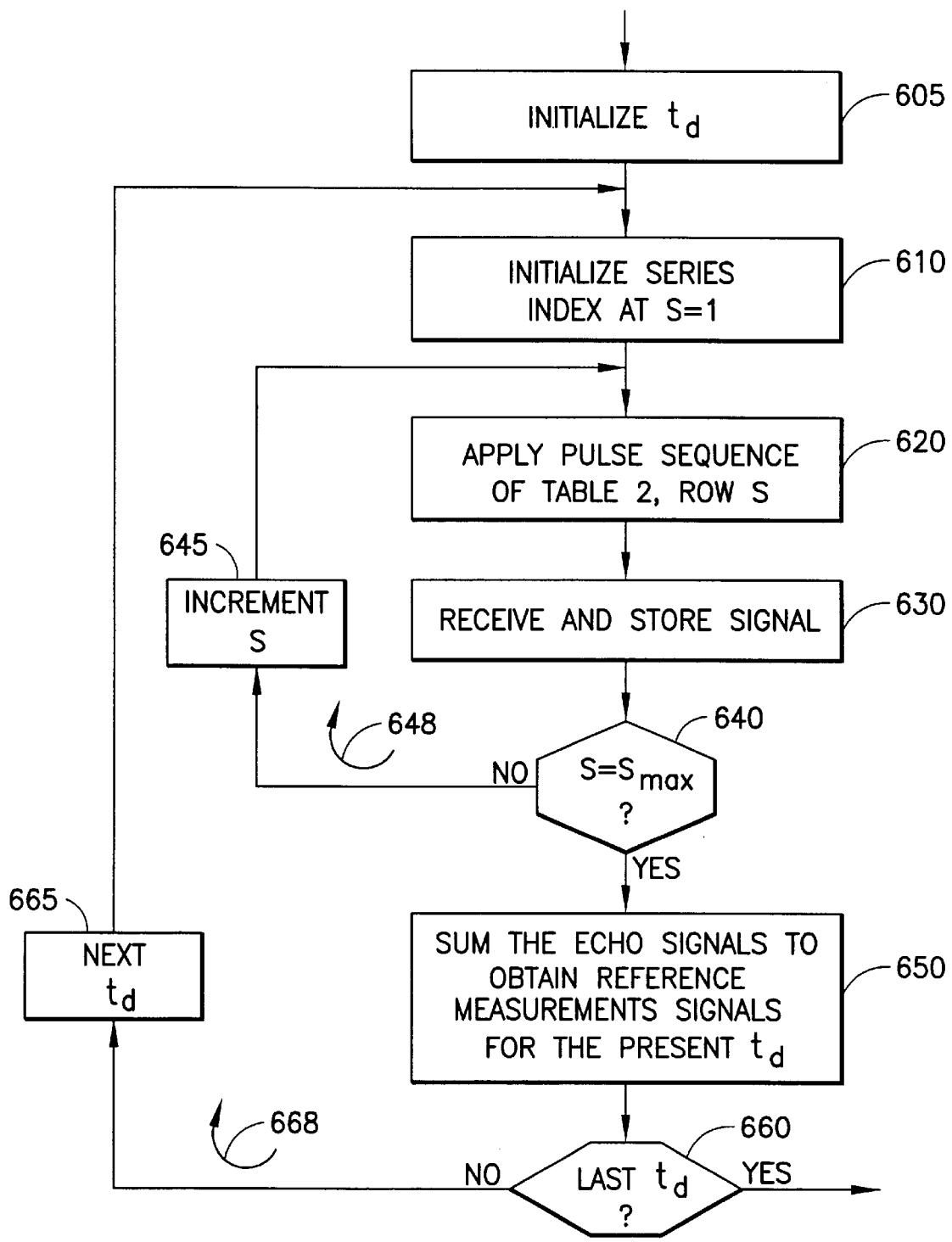
FIG. 6 is a flow diagram of a routine as represented by the block 430 of FIG. 4 for applying reference magnetic pulse sequences and detecting and storing reference measurement signals.

Referring to FIG. 6, there is shown a flow diagram of an embodiment of a routine as represented by the block 420 of FIG. 4. A wait time $t_d$ is initialized to a first value thereof (block 605). The blocks 620 and 630 represent the basic operations of applying the reference pulse sequence (for example, the pulse sequence of (7) above) and receiving and storing the FID's (as measurement signals). Again, however, in an embodiment hereof it is advantageous to use a series of pulse sequences to remove spurious echoes. For example, the series of pulse sequences shown in Table 2 is used in the present embodiment. This is implemented in the flow diagram of FIG. 6 by initializing a "series" index at 1 (as represented by the block 610) the index representing the row of Table 2 whose pulse sequence is to be utilized next. The decision block 640 determines whether the last row of Table 2 has been reached (that is, the index has reached 8 in this example), and, until it is reached, the loop 648 will continue, with the row index being incremented each time (as represented by block 645), so that each pulse sequence in the series is performed, with the detected NMR signals therefrom being stored. When the index reaches 8, the stored signals are summed (block 650) to obtain the measurement signal for the series of pulse sequences, at the present $t_d$, that are unresponsive to the internal field inhomogeneities. Inquiry is then made (decision block 660) as to whether the last value of $t_d$ to be used has been reached. If not, the block 665 is entered, this block representing the setting of $t_d$ to the next value thereof to be used. The loop 668 then continues until signal data has been obtained and stored for each predetermined value of $t_d$.

Figure 7:
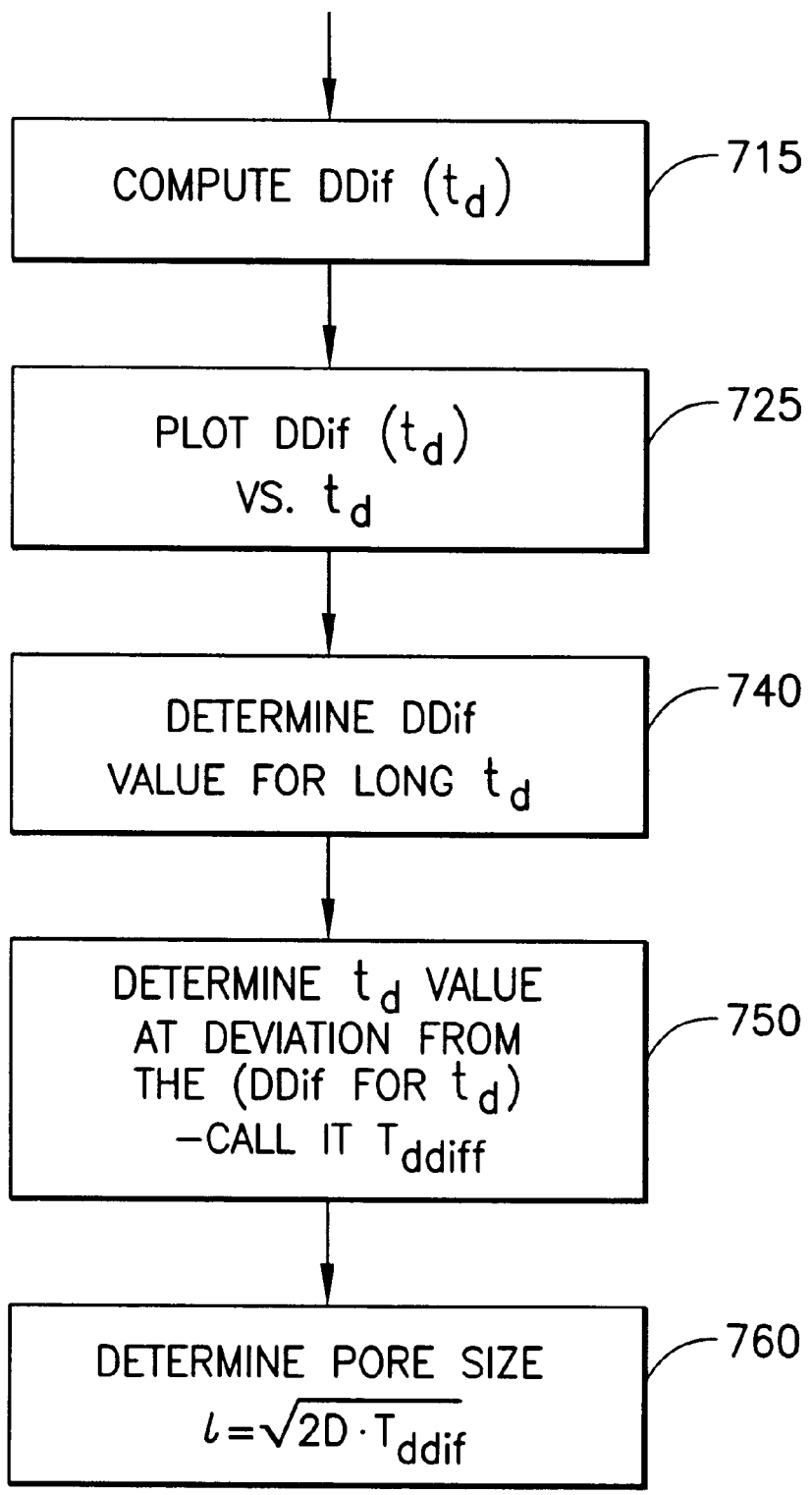
FIG. 7 is a flow diagram of a routine as represented by the block 450 of FIG. 4 for determining a pore characteristic of the formations in the region of investigation.

Referring to FIG. 7, there is shown a flow diagram of the routine, represented by the block 450 of FIG. 4, for determining a pore characteristic (in this case, pore size) of the formations in the region of investigation. The blocks 715 and 725 respectively represent the computation of DDif $(t_d)$ as the ratio of the measurement signal value to the reference signal value, for each value of $t_d$ and the plotting of DDif$(t_d)$ as a function of $t_d$. The DDif $(t_d)$ plot (or function) will generally exhibit a decay at short $t_d$ and a levelling off at long $t_d$. The block 740 represents the determination of DDif for long $t_d$. The block 750 represents the determination of the $t_d$ value where DDif$(t_d)$ begins to deviate from its value for long $t_d$, this value of $t_d$, being called $T_{ddif}$. This can be implemented by determining the horizontal line matching the long $t_d$ value, and then determining the $t_d$ value and define it as $T_{ddif}$. Then, as represented by block 760, the pore size ι can be determined as sqrt (2D·$T_{ddif}$), where D is the diffusion constant of the fluid at the measurement temperature. If the DDif plot exhibits abrupt change of slope at a series of $t_d$ values, then the relationship $$ι=sqrt(2D·T_{ddif})$$

is used to define a series of pore sizes. If insufficient decay is observed in the data, longer $t_e$ can be used and/or if possible, a larger static magnetic field can be used. Conversely, if the decay is too great and the DDif$(t_d)$ signal goes to zero before becoming constant, shorter $t_e$ and/or a smaller static magnetic field can be used. Also, if the decay continues to the longest $t_d$ value used without becoming constant, longer $t_d$'s should be used. It will also be understood that the DDif data can be fit to equation (5) with d and η as fitting parameters. Alternatively, the fitting may be performed on the measurement and reference data separately.

Figure 8:
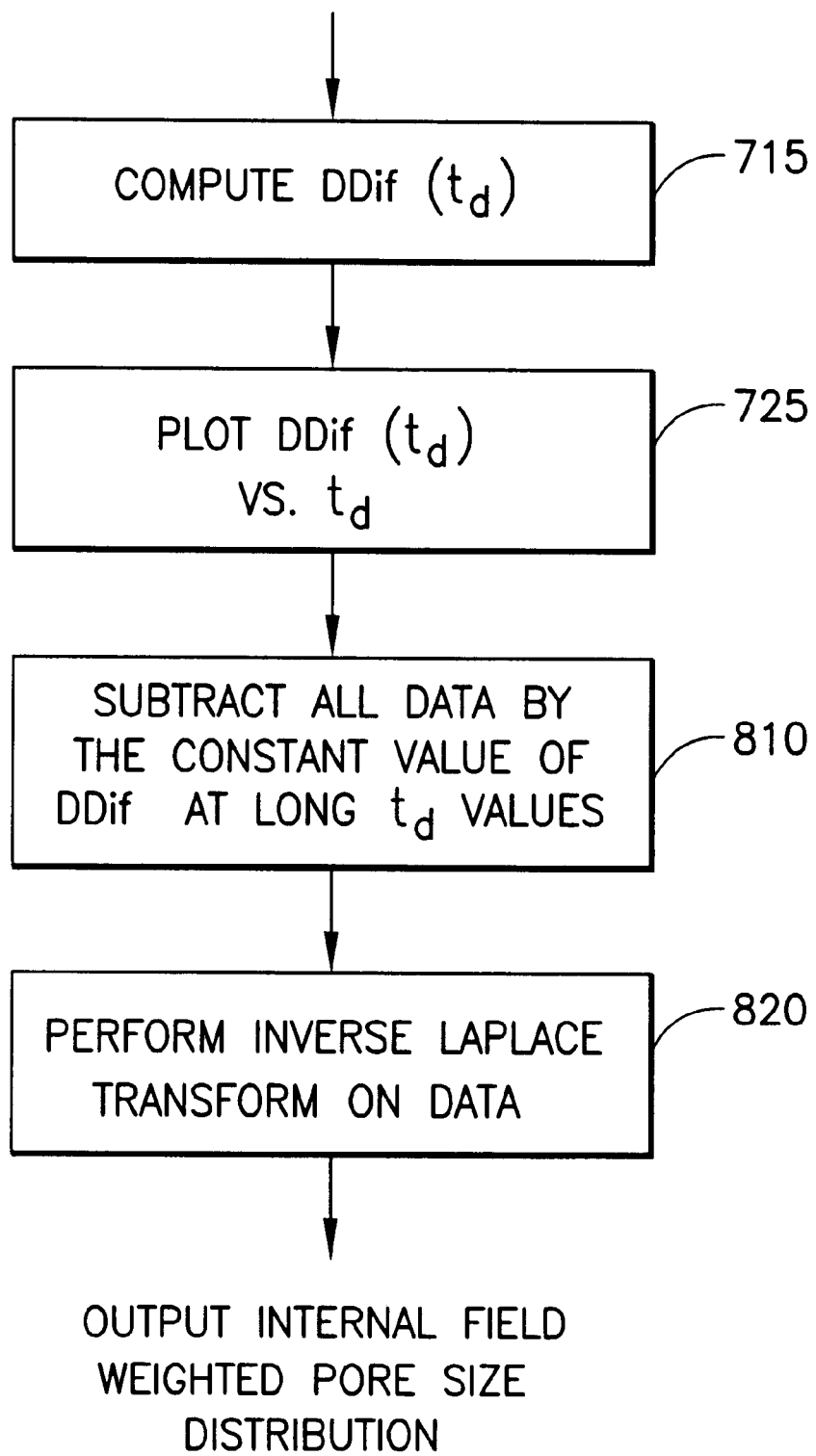
FIG. 8 is a flow diagram of another routine as represented by the block 450 of FIG. 4 for determining a pore characteristic of the formations in the region of investigation.
Figure 9:
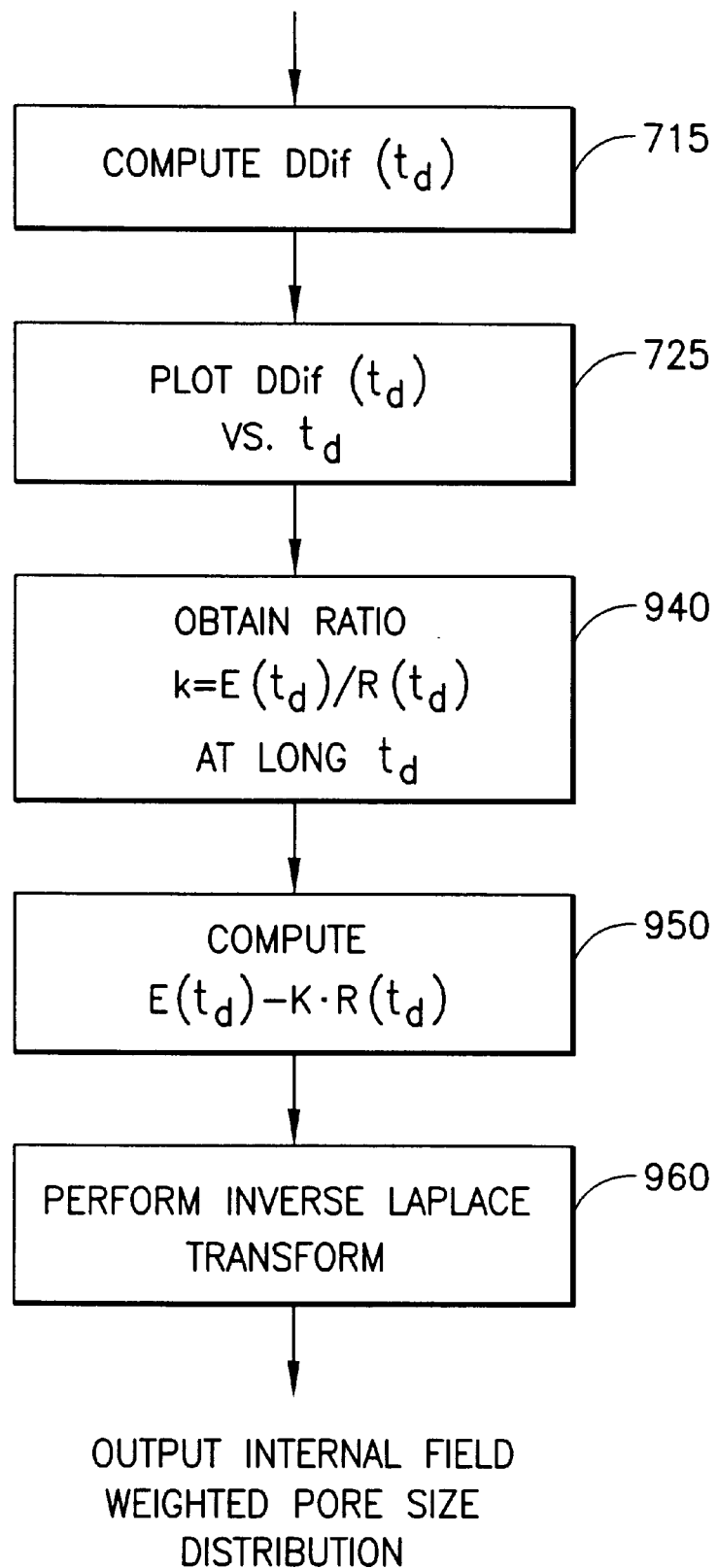
FIG. 9 is a flow diagram of another routine as represented by the block 450 of FIG. 4 for determining a pore characteristic of the formations in the region of investigation.

The technique of the flow diagram of FIG. 7 and the described associated techniques work well when the reference measurement data is close to a single exponential. FIG. 8 is a flow diagram a routine for use in such case, and FIG. 9 is a flow diagram of a routine for use in the case when the measurement data R($t_d$) contains multiple exponential components. In the FIG. 8 routine, the blocks 715 and 725 are the same as their counterparts in FIG. 7. Then, the block 810 represents subtracting all data by the constant value of DDif at long $t_d$ values. The block 820 is then entered, and represents the performing of inverse Laplace transform on the data with respect to $t_d$ (or, alternatively, with respect to sqrt ($t_d$ or log ($t_d$)). The obtained function is then the pore size distribution weighted by the internal field inhomogeneity.

The FIG. 9 routine shows the routine for the situation where the reference measurement data is not close to a single exponential (but can also be used when it is so). In this case, the blocks 715 and 725 are again the same as their counterparts in FIG. 7. In this case, the block 940 represents obtaining the constant ratio k of the data E($t_d$) to the reference R($t_d$) at long $t_d$. Then E($t_d$) is subtracted from k·R($t_d$) (block 950), and inverse Laplace transform is performed on the result (block 960). The obtained function is then the internal field weighted pore size distribution. Alternatively, inverse Laplace transform can be performed on both E($t_d$) and R($t_d$) and the new peaks in the E($t_d$) transform comparing to that of R($t_d$) indicating pore size distribution.

The invention has been described with reference to particular preferred embodiments, but variations within the spirit and scope of the invention will occur to those skilled in the art. For example, it will be understood that other suitable pulse sequences can be employed. Also, it will be understood that the techniques hereof can be used in combination with other measurements and techniques, including but not limited to, measurement of relaxation rates, spectroscopy, diffusion constant, and other pulse field gradient measurements in a fashion similar to multi-dimensional NMR experiments and analysis.

What is claimed is:

1. A method for determining a pore characteristic of a substance, comprising the steps of:
   subjecting the substance to a substantially uniform static magnetic field;
   applying a magnetic pulse sequence to said substance, said pulse sequence being selected to produce nuclear magnetic resonance signals that are responsive to internal magnetic field inhomogeneities in the pore structure of said substance resulting from contrast of the magnetic susceptibility between the solid portion of the substance and the fluid in the pores of the substance, and detecting, as measurement signals, nuclear magnetic resonance signals from said substance;
   applying a reference magnetic pulse sequence to said substance, said reference pulse sequence being selected to produce nuclear magnetic resonance signals that are substantially unresponsive to said internal magnetic field inhomogeneities in the pore structure of said substance, and detecting, as reference measurement signals, nuclear magnetic resonance signals from said substance; and
   determining a pore characteristic of said substance from said measurement signals and said reference measurement signals.

2. The method as defined by claim 1, wherein said steps of applying said magnetic pulse sequence and detecting said measurement signals are performed before said steps of applying said reference magnetic pulse sequence and detecting said reference measurement signals.

3. The method as defined by claim 1, wherein said steps of applying said magnetic pulse sequence and detecting said measurement signals are performed after said steps of applying said reference magnetic pulse sequence and detecting said reference measurement signals.

4. The method as defined by claim 1, wherein said step of subjecting said substance to a substantially uniform static magnetic field comprises applying a substantially uniform static magnetic field to said substance.

5. The method as defined by claim 1, wherein said pore characteristic of said substance is pore size in said substance.

6. The method as defined by claim 1, wherein said pore characteristic of said substance is the pore size distribution in said substance.

7. The method as defined by claim 1, wherein said step of determining a pore characteristic of said substance comprises dividing values derived from said measurement signals by values derived from said reference measurement signals.

8. The method as defined by claim 6, wherein said step of determining the pore size distribution of said substance comprises dividing values derived from said measurement signals by values derived from said reference measurement signals.

9. The method as defined by claim 1, wherein said steps of applying a magnetic pulse sequence and applying a reference magnetic pulse sequence each comprise applying a plurality of pulse sequences that include respective different wait times, $t_d$, during which diffusion in the internal magnetic field inhomogeneities can occur.

10. The method as defined by claim 6, wherein said steps of applying a magnetic pulse sequence and applying a reference magnetic pulse sequence each comprise applying a plurality of pulse sequences that include respective different wait times, $t_d$, during which diffusion in the internal magnetic field inhomogeneities can occur.

11. The method as defined by claim 9, wherein said step of determining a pore characteristic of said substance comprises dividing values derived from said measurement signals by values derived from said reference measurement signals.

12. The method as defined by claim 10, wherein said step of determining a pore characteristic of said substance comprises dividing values derived from said measurement signals by values derived from said reference measurement signals.

13. The method as defined by claim 1, wherein said pulse sequence comprises a series of pulse sequences with phase cycling.

14. The method as defined by claim 9, wherein each of said pulse sequences comprises a series of pulse sequences with phase cycling.

15. The method as defined by claim 14, wherein each of said reference pulse sequences comprises a series of pulse sequences with phase cycling.

16. The method as defined by claim 14, wherein the measurement signals for each of said plurality of pulse sequences are obtained by combining the detected nuclear magnetic resonance signals from the associated series of pulse sequences.

17. The method as defined by claim 11, wherein said step of determining a pore characteristic includes plotting the results of said dividing as a function of $t_d$, and determining said pore characteristic from said plot.

18. The method as defined by claim 12, wherein said step of determining a pore characteristic includes plotting the results of said dividing as a function of $t_d$, and determining said pore characteristic from said plot.

19. The method as defined by claim 9, wherein said magnetic pulse sequence is of the form $$\pi/2\text{-}t_e\text{-}\pi/2\text{-}t_d\text{-}\pi/2\text{-}t_e\text{-echo}$$

wherein the echo comprises said nuclear magnetic resonance signals from said substance that are detected as said measurement signals.

20. The method as defined by claim 10, wherein said magnetic pulse sequence is of the form $$\pi/2\text{-}t_e\text{-}\pi/2\text{-}t_d\text{-}\pi/2\text{-}t_e\text{-echo}$$

wherein the echo comprises said nuclear magnetic resonance signals from said substance that are detected as said measurement signals.

21. The method as defined by claim 11, wherein said magnetic pulse sequence is of the form $$\pi/2\text{-}t_e\text{-}\pi/2\text{-}t_d\text{-}\pi/2\text{-}t_e\text{-echo}$$

wherein the echo comprises said nuclear magnetic resonance signals from said substance that are detected as said measurement signals.

22. The method as defined by claim 19, wherein the last $\pi/2$ pulse of said sequence is replaced by a refocusing sequence, with echoes thereof comprising said nuclear magnetic resonance signals from said substance that are detected as said measurement signals.

23. The method as defined by claim 22, wherein said refocusing sequence is a CPMG sequence.

24. The method as defined by claim 19, wherein said reference magnetic pulse sequence is of the form $$\pi/2\text{-}t_e\text{-}\pi\text{-}t_e\text{-}\pi/2\text{-}t_d\text{-}\pi/2\text{-fid signal}$$

wherein the fid signal comprises said nuclear magnetic resonance signals from said substance that are detected as said reference measurement signals.

25. The method as defined by claim 20, wherein said reference magnetic pulse sequence is of the form $$\pi/2\text{-}t_e\text{-}\pi\text{-}t_e\text{-}\pi/2\text{-}t_d\text{-}\pi/2\text{-fid signal}$$

wherein the fid signal comprises said nuclear magnetic resonance signals from said substance that are detected as said reference measurement signals.

26. The method as defined by claim 21, wherein said reference magnetic pulse sequence is of the form $$\pi/2\text{-}t_e\text{-}\pi\text{-}t_e\text{-}\pi/2\text{-}t_d\text{-}\pi/2\text{-fid signal}$$

wherein the fid signal comprises said nuclear magnetic resonance signals from said substance that are detected as said reference measurement signals.

27. The method as defined by claim 1, further comprising applying a magnetic field gradient to said substance during a portion of said magnetic pulse sequence and during a portion of said reference magnetic pulse sequence.

28. The method as defined by claim 1, wherein the pulses of said magnetic pulse sequences and reference magnetic pulse sequences are RF pulses.

29. A method for determining a pore characteristic of formations surrounding an earth borehole, comprising the steps of:
   suspending a logging device in the borehole;
   applying, from said logging device, a substantially uniform magnetic field in a region of the formations;
   applying, from said logging device, a magnetic pulse sequence to said region, said pulse sequence being selected to produce nuclear magnetic resonance signals that are responsive to internal magnetic field inhomogeneities in the pore structure of said region resulting from contrast of the magnetic susceptibility between the solid portion of the formations of the region and the fluid in the pores of the formations of the region, and detecting, as measurement signals, nuclear magnetic resonance signals from said region;
   applying, from said logging device, a reference magnetic pulse sequence to said region, said reference pulse sequence being selected to produce nuclear magnetic resonance signals that are substantially unresponsive to said internal magnetic field inhomogeneities in the pore structure of said region, and detecting, as reference measurement signals, nuclear magnetic resonance signals from said region; and
   determining a pore characteristic of the formations of said region from said measurement signals and said reference measurement signals.

30. The method as defined by claim 29, wherein said pore characteristic of the formations of said region is pore size in the formations of said region.

31. The method as defined by claim 29, wherein said pore characteristic of the formations of said region is the pore size distribution in the formations of said region.

32. The method as defined by claim 29, wherein said step of determining a pore characteristic of the formations of said region comprises dividing values derived from said measurement signals by values derived from said reference measurement signals.

33. The method as defined by claim 30, wherein said step of determining a pore characteristic of the formations of said region comprises dividing values derived from said measurement signals by values derived from said reference measurement signals.

34. The method as defined by claim 31, wherein said step of determining a pore characteristic of said region comprises dividing values derived from said measurement signals by values derived from said reference measurement signals.

35. The method as defined by claim 29, wherein said pulse sequence comprises a series of pulse sequences with phase cycling.

36. The method as defined by claim 29, wherein said steps of applying a magnetic pulse sequence and applying a reference magnetic pulse sequence each comprise applying a plurality of pulse sequences that include respective different wait times, $t_d$, during which diffusion in the internal magnetic field inhomogeneities can occur.

37. The method as defined by claim 31, wherein said steps of applying a magnetic pulse sequence and applying a reference magnetic pulse sequence each comprise applying a plurality of pulse sequences that include respective different wait times, $t_d$, during which diffusion in the internal magnetic field inhomogeneities can occur.

38. The method as defined by claim 36, wherein said step of determining a pore characteristic of the formations of said region comprises dividing values derived from said measurement signals by values derived from said reference measurement signals.

39. The method as defined by claim 37, wherein said step of determining a pore characteristic of the formations of said region comprises dividing values derived from said measurement signals by values derived from said reference measurement signals.

40. The method as defined by claim 36, wherein each of said pulse sequences comprises a series of pulse sequences with phase cycling.

41. The method as defined by claim 40, wherein the measurement signals for each of said plurality of pulse sequences are obtained by combining the detected nuclear magnetic resonance signals from the associated series of pulse sequences.

42. The method as defined by claim 38, wherein said step of determining a pore characteristic includes plotting the results of said dividing as a function of $t_d$, and determining said pore characteristic from said plot.

43. The method as defined by claim 39, wherein said step of determining a pore characteristic includes plotting the results of said dividing as a function of $t_d$, and determining said pore characteristic from said plot.

44. The method as defined by claim 36, wherein said magnetic pulse sequence is of the form $$\pi/2\text{-}t_e\text{-}\pi/2\text{-}t_d\text{-}\pi/2\text{-}t_e\text{-echo}$$

wherein the echo comprises said nuclear magnetic resonance signals from the formations of said region that are detected as said measurement signals.

45. The method as defined by claim 37, wherein said magnetic pulse sequence is of the form $$\pi/2\text{-}t_e\text{-}\pi/2\text{-}t_d\text{-}\pi/2\text{-}t_e\text{-echo}$$

wherein the echo comprises said nuclear magnetic resonance signals from the formations of said region that are detected as said measurement signals.

46. The method as defined by claim 44, wherein the last $\pi/2$ pulse of said sequence is replaced by a refocusing sequence, with echoes thereof comprising said nuclear magnetic resonance signals from the formations of said region that are detected as said measurement signals.

47. The method as defined by claim 46, wherein said refocusing sequence is a CPMG sequence.

48. The method as defined by claim 44, wherein said reference magnetic pulse sequence is of the form $\pi/2\text{-}t_e\text{-}\pi\text{-}t_e\text{-}\pi/2\text{-}t_d\text{-}\pi/2\text{-fid signal}$ wherein the fid signal comprises said nuclear magnetic resonance signals from the formations of said region that are detected as said reference measurement signals.

49. The method as defined by claim 45, wherein said reference magnetic pulse sequence is of the form $\pi/2\text{-}t_e\text{-}\pi\text{-}t_e\text{-}\pi/2\text{-}t_d\text{-}\pi/2\text{-fid signal}$ wherein the fid signal comprises said nuclear magnetic resonance signals from the formations of said region that are detected as said reference measurement signals.

50. The method as defined by claim 29, further comprising applying a magnetic field gradient to the formations of said region during a portion of said magnetic pulse sequence and during a portion of said reference magnetic pulse sequence.

51. The method as defined by claim 29, wherein the pulses of said magnetic pulse sequences and reference magnetic pulse sequences are RF pulses.

52. Apparatus for determining a pore characteristic of formations surrounding an earth borehole, comprising:

a logging device suspendible in the borehole;

means for applying, from said logging device, a substantially uniform magnetic field in a region of the formations;

means for applying, from said logging device, a magnetic pulse sequence to said region, said pulse sequence being selected to produce nuclear magnetic resonance signals that are responsive to internal magnetic field inhomogeneities in the pore structure of said region resulting from contrast of the magnetic susceptibility between the solid portion of the formations of the region and the fluid in the pores of the formations of the region, and for detecting, as measurement signals, nuclear magnetic resonance signals from said region;

means for applying, from said logging device, a reference magnetic pulse sequence to said region, said reference pulse sequence being selected to produce nuclear magnetic resonance signals that are substantially unresponsive to said internal magnetic field inhomogeneities in the pore structure of said region, and for detecting, as reference measurement signals, nuclear magnetic resonance signals from said region; and means for determining a pore characteristic of the formations of said region from said measurement signals and said reference measurement signals.

53. Apparatus as defined by claim 52, wherein said means for determining a pore characteristic of the formations of said region comprises means for dividing values derived from said measurement signals by values derived from said reference measurement signals.

54. Apparatus as defined by claim 52, wherein said means for applying a magnetic pulse sequence comprises means for applying a plurality of pulse sequences that include respective different wait times, $t_d$, during which diffusion in the internal magnetic field inhomogeneities can occur.

55. Apparatus as defined by claim 53, wherein said means for applying a magnetic pulse sequence comprises means for applying a plurality of pulse sequences that include respective different wait times, $t_d$, during which diffusion in the internal magnetic field inhomogeneities can occur.

* * * * *